United States Patent
Iguchi et al.

(10) Patent No.: US 6,268,108 B1
(45) Date of Patent: *Jul. 31, 2001

(54) COMPOSITION FOR FORMING ANTIREFLECTIVE COATING FILM AND METHOD FOR FORMING RESIST PATTERN USING SAME

(75) Inventors: Etsuko Iguchi, Tokyo; Masakazu Kobayashi, Kanagawa; Hiroshi Komano, Kanagawa; Toshimasa Nakayama, Kanagawa, all of (JP)

(73) Assignee: Tokyo Ohka Kogyo Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,460

(22) Filed: Jul. 16, 1998

(30) Foreign Application Priority Data

Jul. 16, 1997 (JP) .................................................. 9-205480

(51) Int. Cl.⁷ .............................. G03F 7/004; G03F 7/30
(52) U.S. Cl. ........................ 430/271.1; 430/325; 430/327
(58) Field of Search ................................. 430/271.1, 927, 430/913, 325, 327, 270.1

(56) References Cited

U.S. PATENT DOCUMENTS

| | | | |
|---|---|---|---|
| 5,260,172 | * 11/1993 | Ito | 430/323 |
| 5,262,280 | * 11/1993 | Knudsen et al. | 430/312 |
| 5,851,738 | 12/1998 | Thackeray et al. | 430/327 |
| 5,886,102 | 3/1999 | Sinta et al. | 525/154 |
| 5,925,495 | * 7/1999 | Sato et al. | 430/270.1 |
| 6,090,531 | * 7/2000 | Mizutani et al. | 430/325 |

* cited by examiner

*Primary Examiner*—Rosemary E. Ashton
(74) *Attorney, Agent, or Firm*—Sughrue, Mion, Zinn, Macpeak & Seas, PLLC

(57) ABSTRACT

The present invention provides a composition for forming an antireflective coating film which is not liable to intermixing between the resist composition layer and the antireflective coating layer and a method for forming a resist pattern having an excellent dimensional accuracy and section shape. The composition consists of (A) a compound which produces an acid upon irradiation with actinic rays, (B) a compound which undergoes crosslinking reaction in the presence of an acid, (C) a dye and (D) an organic solvent. The method for forming a resist pattern comprises applying the composition for forming an antireflective coating film to a semiconductor substrate, drying the composition coated, irradiating the entire surface of the coated material with actinic rays so that it undergoes crosslinking reaction to form an antireflective coating film thereon, applying a resist composition to the antireflective coating film, drying the coated material, and then subjecting the coated material to lithographic processing to form a resist pattern thereon.

7 Claims, No Drawings

COMPOSITION FOR FORMING ANTIREFLECTIVE COATING FILM AND METHOD FOR FORMING RESIST PATTERN USING SAME

FIELD OF THE INVENTION

The present invention relates to a composition for forming an antireflective coating film and a method for forming a resist pattern using same. More particularly, the present invention relates to a composition for forming an antireflective coating film for preventing the reflection of light from a semiconductor substrate and a method for forming a resist pattern using the composition for forming an antireflective coating film.

BACKGROUND OF THE INVENTION

In the preparation of semiconductor devices such as IC and LSI, it has heretofore been a common practice that various steps such as photolithographic step using a photoresist composition, etching step, impurity diffusion step and wiring step are repeated several times. In the foregoing photolithographic step, a photoresist composition is applied to a semiconductor substrate to form a thin film thereon. The thin film is irradiated with actinic rays through a mask pattern, and then developed to form a resist pattern. As the actinic rays there have been used g-line (436 nm), i-line (365 nm), etc. However, with the enhancement of integration of semiconductor devices, light rays having a shorter wavelength such as far ultraviolet rays and exima laser have been used more and more. The shorter the wavelength of the actinic light rays used, the more light is reflected from the substrate. This causes a great problem that the resist pattern is liable to local strain (notching) or deterioration of dimensional accuracy due to reflected light. Thus, the interposition of an antireflective coating film between the substrate and the resist layer for the purpose of inhibiting the reflection of light has been noted (see JP-B-3-67261 (The term "JP-B" as used herein means an "examined Japanese patent publication")).

With the reduction of the wavelength of the actinic light rays used, emphasis has been placed on resists having a high resolution more and more. These resists have been extensively studied. However, if a resist composition having a high resolution is applied to a substrate having an antireflective coating film formed thereon, a so-called intermixed layer can be easily formed at the interface of the resist composition layer with the antireflective coating film, causing the lower part of the resist pattern to be bitten or expanded and hence making it impossible to form a resist pattern having an excellent section shape. Thus, good semiconductor devices can be hardly produced. This disadvantage becomes remarkable particularly with a chemically-sensitized resist composition capable of forming a resist pattern having an excellent dimensional accuracy and resolution. In order to eliminate these difficulties, an approach involving heat treatment at temperatures higher than 180° C. has been proposed. However, this approach is disadvantageous in that the dye in the antireflective coating film can be easily sublimated, causing stain in the apparatus and other troubles. Thus, this approach is of no practical use.

SUMMARY OF THE INVENTION

It is therefore an object of the present invention to provide a composition for forming an antireflective coating film which is not liable to formation of an intermixed layer between the resist composition layer and the antireflective coating layer.

It is another object of the present invention to provide a method for forming a resist pattern having an excellent dimensional accuracy and section shape using the foregoing composition for forming an antireflective coating film. These and other objects of the present invention will become more apparent from the following detailed description and examples.

The inventors made extensive studies of solution to the foregoing problems. As a result, it was found that the use of a composition for forming an antireflective coating film comprising a compound which produces an acid upon irradiation with actinic rays, a compound which undergoes crosslinking reaction in the presence of an acid and a dye makes it possible to form an antireflective coating film without the necessity of high temperature treatment and inhibit the formation of an intermixed layer, enabling the formation of a resist pattern having an excellent dimensional accuracy and section shape free from bite and expansion of the lower part of the resist pattern by the resist pattern.

Namely, the foregoing objects are accomplished with a composition for forming an antireflective coating film comprising (A) a compound which produces an acid upon irradiation with actinic rays, (B) a compound which undergoes crosslinking reaction in the presence of an acid and (C) a dye and a method for forming a resist pattern which comprises applying the above-specified composition for forming an antireflective coating film to a semiconductor substrate, drying the applied composition, irradiating the entire surface of the dried composition with actinic rays so that the composition undergoes crosslinking reaction to form an antireflective coating film, applying a resist composition to the antireflective coating film, drying the applied resist composition, and then subjecting the resist composition to lithographic processing to form a resist pattern.

DETAILED DESCRIPTION OF THE INVENTION

The present invention will be further described hereinafter.

As the compound which produces an acid upon irradiation with actinic rays to be used as the component (A) (hereinafter referred to as "acid generator") there may be used a known acid generator without any special restriction. Specific examples of such an acid generator include (a) bissulfonyldiazomethanes such as bis(p-toluenesulfonyl) diazomethane, methylsulfonyl-p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, bis(2,4-dimethylphenylsulfonyl)diazomethane, bis(4-ethylphenylsulfonyl)diazomethane, bis(3-methylphenylsulfonyl)diazomethane, bis(4-methoxyphenylsulfonyl)diazomethane, bis(4-fluorophenylsulfonyl)diazomethane, bis(4-chlorophenylsulfonyl)diazomethane and bis(4-tert-butylphenylsulfonyl)diazomethane, (b) nitrobenzyl derivatives such as p-toluenesulfonic acid 2-nitrobenzyl, p-toluenesulfonic acid-2,6-dinitrobenzyl and p-trifluoromethyl benzenesulfonic acid-2,4-dinitrobenzyl, (c) aliphatic or aromatic sulfonic acid esters of polyhydroxy compound such as methanesulfonic acid ester of pyrogallol (pyrogalloltrimesylate), benzenesulfonic acid ester of pyrogallol, p-toluenesulfonic acid ester of pyrogallol, p-methoxybenzenesulfonic acid ester of pyrogallol, mesitylenesulfonic acid ester of pyrogallol, benzylsulfonic acid ester of pyrogallol, methanesulfonic acid ester of alkyl gallate, benzenesulfonic acid ester of alkyl gallate, p-toluenesulfonic acid ester of alkyl gallate, p-methoxybenzenesulfonic acid ester of alkyl gallate, mesitylenesulfonic acid ester of alkyl gallate and benzylsulfonic acid ester of alkyl gallate, (d) onium salts such as diphenyliodonium tetrafluoroborate, diphenyliodonium hexafluorophosphate, diphenyliodonium hexafluoroantimonate, diphenyliodonium trifluoromethanesulfonate, (4-methoxyphenyl) phenyliodonium hexafluoroantimonate, (4-methoxyphenyl) phenyliodonium trifluoromethanesulfonate, bis(p-tert-butylphenyl)iodonium tetrafluoroborate, bis(p-tert-butylphenyl)iodonium hexafluorophosphate, bis(p-tert-butylphenyl)iodonium hexafluoroantimonate, bis(p-tert-butylphenyl)iodonium trifluoromethanesulfonate, triphenyl sulfonium hexafluorophosphate, triphenylsulfonium hexafluoroantimonate and triphenylsulfonium trifluoromethanesulfonate, (e) sulfoniuncarbonylalkanes such as 2-methyl-2-(p-toluenesulfonyl)propiophenone, 2-(cyclohexylcarbonyl)-2-(p-toluenesulfonyl)propane, 2-methanesulfonyl-2-methyl-(4-methylthio)propiophenone and 2,4-dimethyl-2-(p-toluenesulfonyl)pentane-3-one, (f) sulfonylcarbonyldiazomethanes such as 1-p-toluenesulfonyl-1-cyclohexylcarbonyldiazomethane, 1-diazo-1-methylsulfonyl-4-phenyl-2-butanone, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl 2-diazo-2-methanesulfonylacetic acetate, cyclohexyl 2-diazo-2-benzenesulfonylacetate and tert-butyl 2-diazo-2-(p-toluenesulfonyl)acetate, (g) benzoin tosylates such as benzoin tosylate and α-methylbenzoin tosylate, (h) halogen-containing triazine compounds such as 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, tris(2,3-dibromopropyl)-1,3,5-triazine and tris(2,3)-dibromopropyl) isocyanurate, (i)oximsulfonate-based compounds such as α-(methylsulfonyloxyimino)phenylacetonitrile, α-(toluenesulfonyloxyimino)phenylacetonitrile, α-(p-chlorobenzenesulfonyloxyimino)phenylacetonitrile, α-(4-nitrobenzenesulfonyloxyimino)phenylacetonitrile, α-(4-nitro-2-trifluoromethylbenzenesulfonyloxyimino) phenylacetonitrile, α-(methylsulfonyloxyimino)-1-phenylacetonitrile, α-(methylsulfonyloxyimino)-4-methoxyphenylacetonitrile, α-(methylsulfonyloxyimino)-1-(p-methylphenyl)acetonitrile, α-(methylsulfonyloxyimino)-1-(p-methoxyphenyl)acetonitrile, α-(benzenesulfonyloxyimino)-4-chlorophenylacetonitrile, α-(benzenesulfonyloxyimino)-2,4-dichlorophenylacetonitrile, α-(benzenesulfonyloxyimino)-2,6-dichlorophenylacetonitrile, α-(benzenesulfonyloxyimino)-2,4-dichlorophenylacetonitrile, α-(benzenesulfonyloxyimino)-4-methoxyphenylacetonitrile, α-(2-chlorobenzenesulfonyloxyimino)-4-methoxyphenylacetonitrile, α-(benzenesulfonyloxyimino)-2-chenylacetonitrile, α-(4-dodecylbenzenesulfonyloxyimino)phenylacetonitrile, α-(toluenesulfonyloxyimino)-4-methoxyphenylacetonitrile, α-(4-dodecylbenzenesulfonyloxyimino)-4-methoxyphenylacetonitrile, α-(trisulfonyloxyimino)-3-chenylacetonitrile, α-(benzenesulfonyloxyimino)-4-methoxyphenylacetonitrile, α-(ethylsulfonyloxyimino)-4-methoxyphenylacetonitrile, α-(trifluoromethylsulfonyloxyimino)-4-methoxyphenylacetonitrile, α-(propylsulfonyloxyimino)-4-methoxyphenylacetonitrile, α-(methylsulfonyloxyimino)-4-bromophenylacetonitrile, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-1-cyclohexenylacetonitrile, α-(ethylsulfonyloxyimino)ethylacetonitrile, α-(propylsulfonyloxyimino)propylacetonitrile, α-(cyclohexylsulfonyloxyimino)cyclopentylacetonitrile, α-(cyclohexylsulfonyloxyimino)cyclohexylacetonitrile, α-(cyclohexylsulfonyloxyimino)-1-cyclopentenylacetonitrile, α-(1-naphthylsulfonyloxyimino)-4-methoxybenzyl cyanide, α-(2-naphthylsulfonyloxyimino)-4-methoxybenzyl cyanide, α-(1-naphthylsulfonyloxyimino)benzyl cyanide, α-(2-naphthylsulfonyloxyimino)benzyl cyanide, α-(10-camphorsulfonyloxyimino)-4-methoxybenzyl cyanide, α-(10-camphorsulfonyloxyimino)benzyl cyanide, α-(3-camphorsulfonyloxyimino)-4-methoxybenzyl cyanide, α-(3-bromo-10-camphorsulfonyloxyimino)-4-methoxybenzyl cyanide and compounds represented by the following chemical formulae:

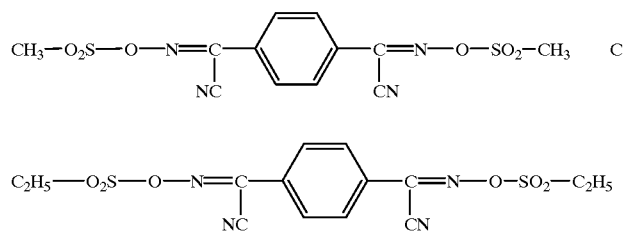

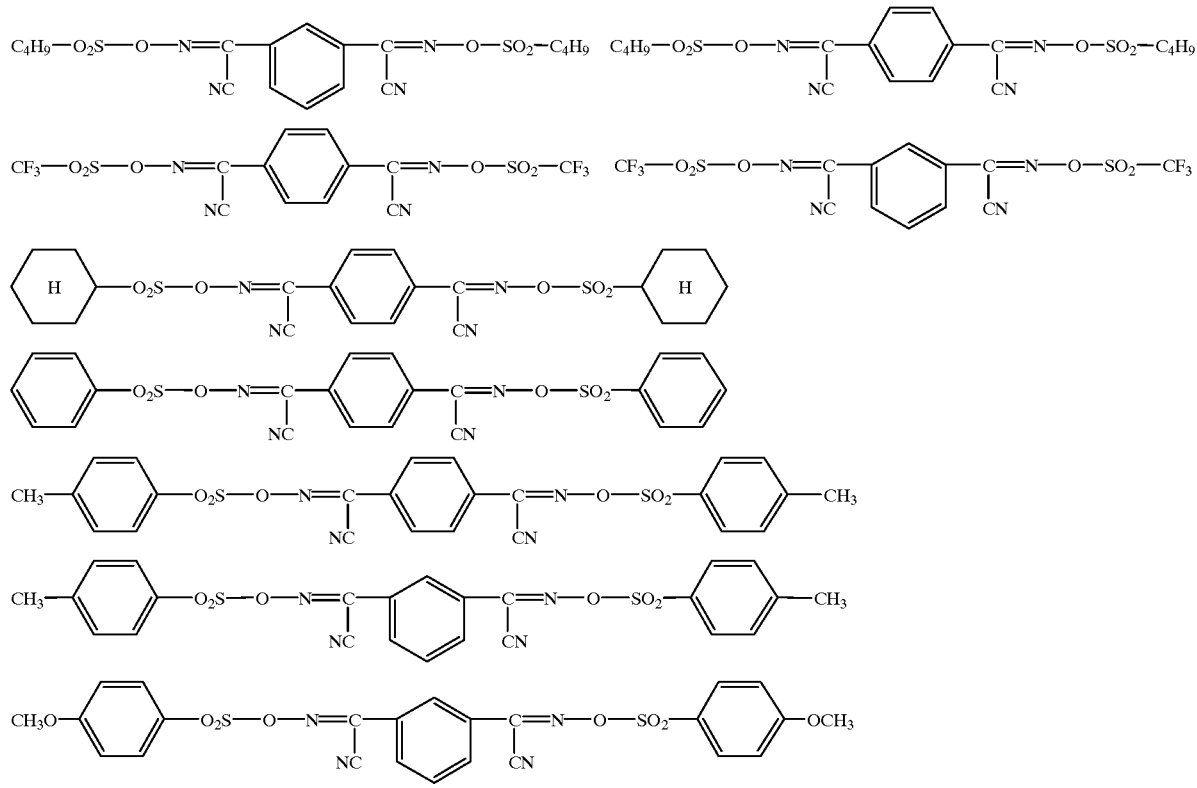

and (j) imide-based compounds such as N-methylsulfonyloxy succinimide, N-isopropylsulfonyloxy succinimide, N-chloroethylsulfonyloxy succinimide, N-(p-methoxyphenyl)sulfonyloxy succinimide, N-(p-biphenyl)sulfonyloxy succinimide, N-naphthylsulfonyloxy succinimide, N-phenylsulfonyloxy succinimide, N-(2,3,6-triphenyl)sulfonyl succinimide, N-methylsulfonyl maleimide, N-isopropylsulfonyloxy maleimide, N-chloroethylsulfonyloxy maleimide, N-(p-methoxyphenyl)sulfonyloxy maleimide, N-(p-vinylphenyl)sulfonyloxy maleimide, N-naphthylsulfonyloxy maleimide, N-phenylsulfonyloxy maleimide, N-(2,3,6-triphenyl)sulfonyloxy maleimide, N-methylsulfonyloxy phthalimide, N-isopropylsulfonyloxy phthalimide, N-chloroethylsulfonyloxy phthalimide, N-(p-methoxyphenyl)sulfonyloxy phthalimide, N-(p-vinylphenyl)sulfonyloxy phthalimide, N-naphthylsulfonyloxy phthalimide, N-phenylsulfonyloxy phthalimide and N-(2,3,6-triphenyl)sulfonyloxy phthalimide. These acid generators may be used singly or in combination.

As the compound which undergoes crosslinking reaction in the presence of an acid to be used as the component (B) (hereinafter referred to as "crosslinking agent") there may be used a compound containing a functional group capable of crosslinking with itself or a dye used in combination therewith, upon heating and/or in the presence of an acid generated from the acid generator. Examples of such a compound include a nitrogen-containing compound containing at least two amino groups substituted by either or both of hydroxyl group and alkoxyalkyl group. Examples of such a nitrogen-containing compound include melamine, urea, guanamine, benzoguanamine, glycoluryl, succinylamide and ethyleneurea in which the hydrogen atom in the amino group of which is substituted by either or both of methylol group and alkoxymethyl group. These nitrogen-containing compounds can be easily produced by a process which comprises reacting melamine, urea, guanamine, benzoguanamine, glycoluryl, succinylamide, ethyleneurea or the like with formalin in boiling water to effect methylolation, or reacting them with a lower alcohol such as methanol, ethanol, n-propanol and isopropanol to effect alkoxylation. In particular, the compound represented by the following general formula (I) is excellent in crosslinking reactivity to advantage:

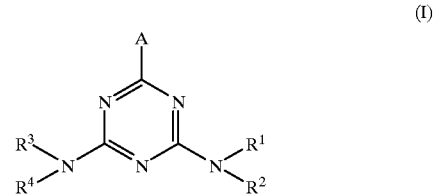

wherein A represents a hydrogen atom, an alkyl group (preferably those having 1 to 6 carbon atoms), an aralkyl group (preferably those having 6 to 10 carbon atoms), an aryl group (preferably those having 6 to 10 carbon atoms) or —$NR^5R^6$; and $R^1$, $R^2$, $R^3$, $R^4$, $R^5$ and $R^6$ may be the same or different and each represent a hydrogen atom, a methylol group or an alkoxymethyl group (preferably those having 2 to 6 carbon atoms), with the proviso that at least two of four to six $R^1$, $R^2$, $R^3$, $R^4$, $R^5$ and $R^6$'s are methylol groups or alkoxymethyl groups.

Preferred among these nitrogen-containing compounds are melamine derivatives containing from not less than 3 to less than 6 methylol or alkoxymethyl groups per melamine ring on the average and benzoguanamine derivatives. Specific examples of the foregoing melamine derivatives include $M_X$-750, a melamine derivative substituted by 3.7 methoxymethyl groups per melamine ring on the average commercially available from Sanwa Chemical Co., Ltd., and $M_W$-30, a melamine derivative substituted by 5.8 methoxymethyl groups per melamine ring on the average commercially available from Sanwa Chemical Co., Ltd. Specific examples of the benzoguanamine derivatives include Cymel Series (produced by Mitsui Cyanamid Co., Ltd.). The foregoing nitrogen-containing compound may be dimeric or trimeric. The foregoing crosslinking agents may be used singly or in combination.

As the dye to be used as the component (C) there may be used a benzophenone-based compound, azomethine-based compound, diphenylsulfone-based compound, diphenyl sulfoxide-based compound or the like. Specific examples of these compounds include benzophenone-based compounds such as 2,2',4,4'-tetrahydroxybenzophenone, 2-hydroxy-4'-dimethylaminobenzophenone, 2,4-dihydroxy-4'-dimethylaminobenzophenone, 2, 4-dihydroxy-4'-diethylaminobenzophenone, 4,4'-bis(dimethylamino) benzophenone and 4,4'-bis(diethylamino)benzophenone, 3-hydroxy-N-(4-diethylaminobenzylidene)aniline, 2-hydroxy-N-(4-diethylaminobenzylidene)aniline, 4-hydroxy-N-(4-diethylaminobenzylidene)aniline, 4-hydroxy-N-(4-diethylaminobenzylidene)-1-naphthylamine, 2-hydroxy-5-chloro-N-(4-diethylaminobenzylidene)aniline, 2,4-dihydroxy-N-(4-diethylaminobenzylidene)aniline, 3-nitro-4-hydroxy-N-(4-diethylaminobenzylidene)aniline, 2-methyl-4-hydroxy-N-(4-diethylaminobenzylidene)aniline, 3-hydroxy-4-methoxy-N-(4-diethylaminobenzylidene)aniline, 4-diethylamino-N-(3-hydroxy-4-methoxybenzylidene)aniline, and azomethine-based compounds represented by the following chemical formulae 14 to 19:

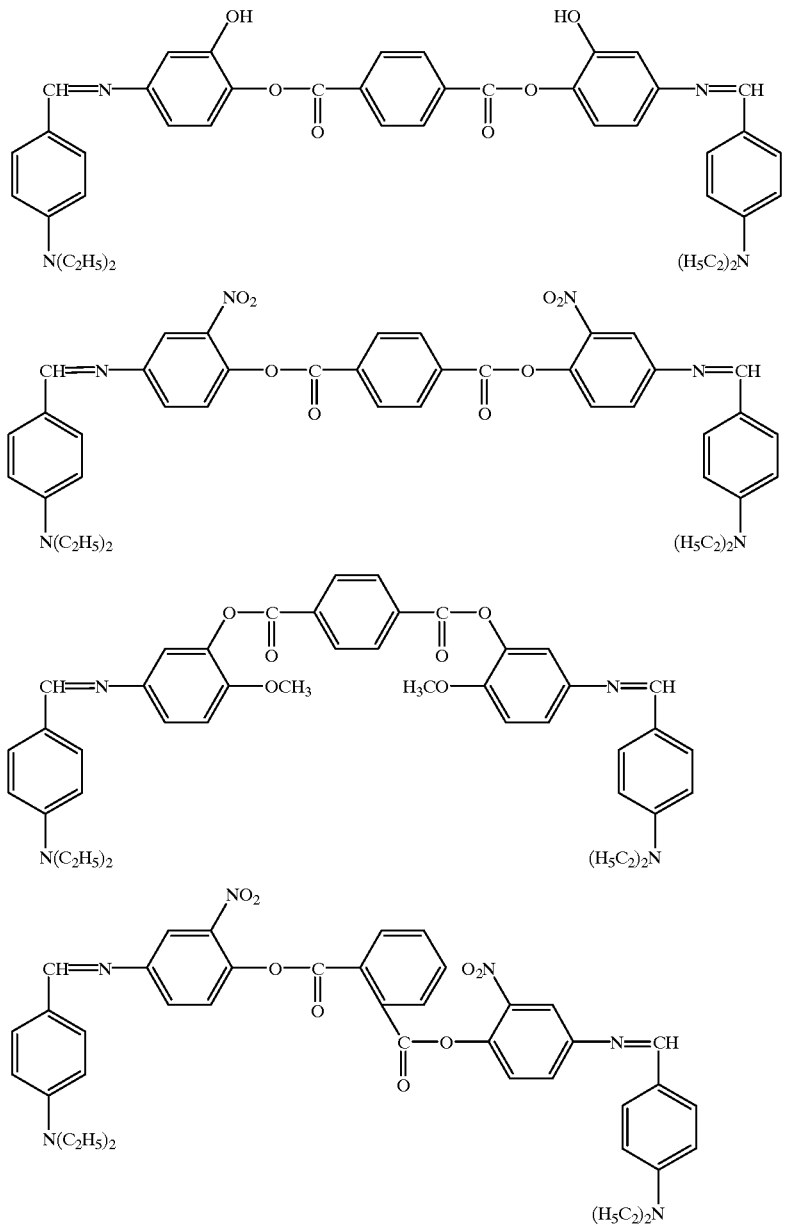

-continued

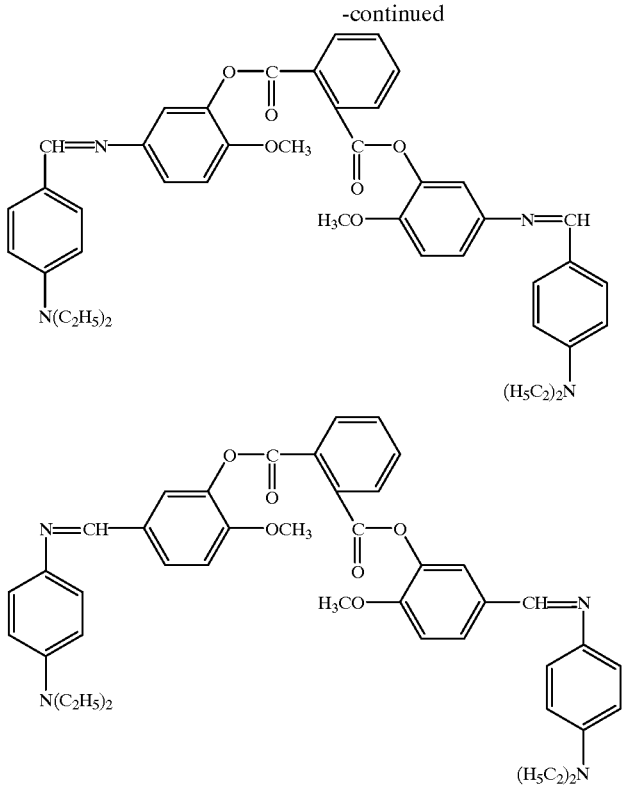

Further examples of the dye include diphenylsulfone-based compounds such as bis(2,4-dihydroxyphenyl)sulfone, bis(3,4-dihydroxyphenyl)sulfone, bis(3,5-dihydroxyphenyl)sulfone, bis(3,6-dihydroxyphenyl)sulfone, bis(4-hydroxyphenyl)sulfone, bis(3-hydroxyphenyl)sulfone and bis(3,5-dimethyl-4-hydroxyphenyl)sulfone, and diphenyl sulfoxide-based compounds such as bis(2,3-dihydroxyphenyl)sulfoxide, bis(5-chloro-2,3-dihydroxyphenyl)sulfoxide, bis(2,4-dihydroxyphenyl)sulfoxide, bis (2,4-dihydroxy-6-methylphenyl)sulfoxide, bis (5-chloro-2,4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxyphenyl)sulfoxide and bis(5-chloro-2,4,6-trihydroxyphenyl)sulfoxide. These dyes may be used singly or in combination.

As mentioned above, the composition for forming an antireflective coating film of the present invention comprises a known acid generator, crosslinking agent and dye in combination. When irradiated with actinic rays, the composition for forming an antireflective coating film of the present invention can easily undergo crosslinking reaction to inhibit the formation of a layer intermixed with resist. The content of the component (B) in the foregoing composition for forming an antireflective coating film is generally from 10 to 300 parts by weight, preferably from 20 to 200 parts by weight, based on 100 parts by weight of the component (C). The content of the component (A) is generally from 0.1 to 30 parts by weight, preferably from 1 to 15 parts by weight, based on 100 parts by weight of the sum of the content of the components (B) and (C).

Besides the foregoing components, the composition for forming an antireflective coating film of the present invention may further comprise a binder resin such as polyamidic acid, polystyrene, halogenated polymer, polyacetal, polyacetal copolymer, α-substituted vinyl polymer, polybutenesulfonic acid and acrylic acid or a compatible additive such as organic acid (e.g., acetic acid, oxalic acid, maleic acid, o-hydroxybenzoic acid, 3,5-dinitrobenzoic acid, 2,6-dihydroxybenzoic acid, copolymer of o-hydroxybenzoic acid and p-xylene (trade name: SAX, produced by Mitsui Toatsu Chemicals, Inc.)) incorporated therein.

The composition for forming an antireflective coating film of the present invention may further comprise a common additive such as surface acting agent incorporated therein for the purpose of improving the coatability or inhibiting striation as necessary. Examples of the foregoing surface actinic agent include fluorine-based surface acting agents such as SURFLON SC-103, SR-100 (produced by Asahi Glass Co., Ltd.), EF-351 (produced by Tohoku Hiryou K.K.), and FLORAD $F_C$-431 and FLORAD $F_C$-176 (produced by Sumitomo 3M Limited). The composition for forming an antireflective coating film of the present invention may further comprise a plasticizer, stabilizer, etc. incorporated therein. The content of these additives is preferably less than 2,000 ppm based on the solid content of the composition solution for forming an antireflective coating film.

The composition for forming an antireflective coating film of the present invention comprising the foregoing components is used in the form of solution in a solvent. Specific examples of such a solvent include ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol monopropyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monophenyl ether acetate, propylene glycol monomethyl ether acetate, propylene glycol monoethyl ether acetate, propylene glycol monopropyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclopentanone, cyclohexanone, methyl propionate, ethyl propionate, propyl propionate, isopropyl propionate, methyl 2-hydroxypropionate, ethyl 2-hydroxypropionate, 2-hydroxy-2-methyl-3-methoxypropionate, ethyl-3-methoxypropionate, ethyl-3-ethoxypropionate, ethyl-3-propoxypropionate, propyl-3-methoxypropionate, isopropyl-3-methoxypropionate, ethyl ethoxyacetate, ethyl oxyacetate, methyl 2-hydroxy-3-methylbutanate, methyl lactate, ethyl lactate, propyl lactate, isopropyl lactate, butyl lactate, isoamyl lactate, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl methyl ether, benzyl ethyl ether, dihexyl ether, benzyl acetate, ethyl benzoate, diethyl oxalate, diethyl maleate, γ-butyrolactone, benzene, toluene, xylene, cyclohexanone, methanol, ethanol, propanol, butanol, hexanol, cyclohexanol, ethylene glycol, diethylene glycol, and glycerin. These solvents may be used singly or in admixture.

The method for forming a resist pattern using the foregoing composition for forming an antireflective coating film will be described hereinafter. In other words, the method for forming a resist pattern comprises steps of (i) dissolving a composition for forming an antireflective coating film in a solvent to prepare a coating solution, applying the coating solution to a substrate such as silicon wafer and glass substrate by a known coating means such as applicator, bar coater, spinner and curtain flow coater and drying the coated material to provide an antireflective coating film, (ii) irradiating the entire surface of the antireflective coating film with ultraviolet rays so that it undergoes crosslinking reaction, and (iii) forming a resist layer on the antireflective coating film and subjecting the material to lithographic processing to form a resist pattern thereon. The step (ii) may be followed by heat treatment, whereby a homogeneous antireflective coating film can be formed to prevent the formation of an intermixed layer. The heat treatment can be effected at the temperature which the dye in the antireflective coating film is not sublimated at, for example, from 90° C. to 160° C. The antireflective coating film which is exposed with the resist pattern thus formed as a mask is removed by dry etching. The resist pattern thus obtained is faithful to the mask pattern and has a high dimensional accuracy and a rectangular section.

The thickness of the layer of the composition for forming an antireflective coating film formed at the step (i) in the foregoing method for forming a resist pattern may be such that the surface of the substrate can be covered, for example, from 30 to 200 nm, and may be properly selected depending on the magnitude of the roughness of the surface of the substrate. Examples of the light source to be used at the step (ii) include low voltage mercury vapor lamp, high voltage mercury vapor lamp, and ultrahigh voltage mercury vapor lamp. A preferred example of the light source is a lamp having the highest intensity at a wavelength range of from 100 to 300 nm. An ultrahigh voltage mercury vapor lamp is most preferred. It is preferred that the antireflective coating film be irradiated with ultraviolet rays having a wavelength of from 100 to 300 nm at 100 mJ/cm$^2$ at least.

As the resist to be used at the step of forming a resist pattern there may be used either a positive-working or negative-working resist. Examples of the positive-working resist include a positive-working resist containing an alkali-soluble novolak resin and naphthoquinone-1,2-diazidesulfonic acid ester, a chemically-sensitized positive-working resist containing an alkali-insoluble resin component containing an acid-dissociating substituent, which enhances solubility in an alkali when acted on by an acid, and a compound which produces an acid upon irradiation with radiation, and a chemically-sensitized positive-working resist containing an alkali-soluble resin, a low molecular weight, compound containing an acid-dissociating substituent and being alkali-soluble, which enhances solubility in an alkali when acted on by an acid, and a compound which produces an acid upon irradiation with radiation. Examples of the negative-working resist include a chemically-sensitized negative-working resist containing an alkali-soluble novolak resin or an alkali-insoluble resin component containing an acid-dissociating substituent which enhances solubility in an alkali when acted on by an acid, an acid crosslinking component, and a compound which produces an acid upon irradiation with radiation, and a photopolymerizable negative-working resist containing an alkaline crosslinkable resin, a monomer containing an ethylenically unsaturated double bond, a photopolymerization initiator and a dye or pigment.

As the developer to be used in development at the lithographic processing step there can be used a general-purpose alkaline developer such as aqueous solution of hydroxide, carbonate, bicarbonate, phosphate or pyrophosphate of alkaline metal (e.g., lithium, sodium, potassium, calcium), primary amine (e.g., benzylamine, butylamine), secondary amine (e.g., dimethylamine, dibenzylamine, diethanolamine), tertiary amine (e.g., trimethylamine, triethylamine, triethanolamine), cyclic amine (e.g., morpholine, piperazine, pyridine), polyamine (e.g., ethylenediamine, hexamethylenediamine), ammonium hydroxide (e.g., tetraethylammonium hydroxide, trimethylbenzylammonium hydroxide, trimethylphenylbenzylammonium hydroxide) or sulfonium hydroxide (e.g., trimethylsulfonium hydroxide, diethylmethylsulfonium hydroxide, dimethylbenzylsulfonium hydroxide), choline and silicate-containing buffer.

The present invention will be further described in the following examples, but the present invention should not be construed as being limited thereto.

EXAMPLE 1

5 g of $M_X$-750, a melamine derivative substituted by 3.7 methoxymethyl groups per melamine ring on the average commercially available from Sanwa Chemical Co., Ltd., 3 g of 4, 4-bis(diethylamino)benzophenone, 2 g of 2,2',4,4'-tetrahydroxybenzophenone and 0.5 g of α-(methylsulfonyloxyimino)phenylacetonitrile were dissolved in 150 g of propylene glycol monomethyl ether acetate. The solution thus obtained was then filtered through a membrane filter having a pore diameter of 0.2 μm to prepare a composition solution for forming an antireflective coating film. The composition solution thus obtained was applied to a silicon wafer by means of a spinner, dried at a temperature of 90° C. for 90 seconds, entirely irradiated with light from a 5 kW ultrahigh voltage mercury vapor lamp having the highest intensity (185 mJ/cm$^2$) at 254 nm, and then subjected to heat treatment at a temperature of 150° C. for 3 minutes to form an antireflective coating film.

Separately, 100 parts by weight of a copolymer of hydroxystyrene and styrene having a weight-average molecular weight of 25,000 and 15 parts by weight of a melamine resin crosslinking agent (trade name: M$_x$-30, produced by Sanwa Chemical Co., Ltd.) were dissolved in 480 parts by weight of propylene glycol monomethyl ether acetate. In the solution thus obtained was then dissolved 3 parts by weight of α-(4-toluenesulfonyloxyimino)phenylacetonitrile to prepare a negative-working resist. The negative-working resist thus prepared was applied onto the foregoing antireflective coating film by means of a spinner, and then dried at a temperature of 90° C. for 90 seconds to form a negative-working resist film having a thickness of 1.00 μm. The negative-working resist film thus formed was exposed to light through a mask using a Type NSR-2005I10D reduced projection exposure apparatus (produced by NIKON CORPORATION), heated to a temperature of 110° C. for 90 seconds, developed with a 2.38 wt % aqueous solution of tetramethylammonium hydroxide for 65 seconds, rinsed for 30 seconds, and then dried to form a resist pattern. A section of the 0.3 μm wide resist pattern was then observed for shape on electron microphotograph. As a result, the resist pattern was found to be a rectangular pattern perpendicular to the antireflective coating film. Further, no bite was observed at the area where the antireflective coating film and the resist film come in contact with each other. Moreover, no intermixed layer was observed.

Subsequently, using a plasma etching apparatus (trade name: TUE-1102, produced by TOKYO OHKA KOGYO CO., LTD.), the antireflective coating film which had been exposed with the negative-working resist pattern as a mask was subjected to dry etching with chlorine gas at a pressure of 30 mTorr, an output of 150 W and a temperature of 20° C. As a result, an image having a high dimensional accuracy faithful to the mask pattern was formed on the silicon wafer.

EXAMPLE 2

A 0.3 μm wide resist pattern was formed in the same manner as in Example 1 except that a composition solution for forming an antireflective coating film was prepared by a process which comprises dissolving 8 g of Cymel 1123 (benzoguanamine derivative produced by Mitsui Cyanamid Co., Ltd.), 2 g of bis(4-hydroxyphenyl)sulfone and 0.5 g of α-(4-toluenesulfonyloxyimino)phenylacetonitrile in 150 g of propylene glycol monomethyl ether acetate, and then filtering the solution through a membrane filter having a pore diameter of 0.2 μm was used. A section of the resist pattern thus formed was observed for shape on electron microphotograph. As a result, the resist pattern was found to be a rectangular pattern perpendicular to the antireflective coating film. Further, no bite was observed at the area where the antireflective coating film and the resist film come in contact with each other. Moreover, no intermixed layer was observed. Subsequently, the antireflective coating film was subjected to dry etching with the resist pattern thus formed as a mask in the same manner as in Example 1. As a result, an image having a high dimensional accuracy faithful to the mask pattern was formed on the silicon wafer.

EXAMPLE 3

A resist pattern was formed in the same manner as in Example 1 except that the negative-working resist used in Example 1 was replaced by TDUR-P007 (chemically-sensitized positive-working resist containing an acid generator and a hydroxystyrene resin, produced by TOKYO OHKA KOGYO CO., LTD.) which was applied to the antireflective coating film by means of a spinner, and then dried at a temperature of 90° C. for 90 seconds to form a positive-working resist film having a thickness of 0.7 μm, and then the resist film was exposed to light using a Type NSR-2005EX8A reduced projection exposure apparatus (produced by NIKON CORPORATION). A section of the resist pattern thus formed was observed for shape on electron microphotograph. As a result, the resist pattern was found to be a rectangular pattern perpendicular to the antireflective coating film. Further, no bite was observed at the area where the antireflective coating film and the resist film come in contact with each other. Moreover, no intermixed layer was observed.

Subsequently, the antireflective coating film was subjected to dry etching with the positive-working resist pattern thus formed as a mask in the same manner as in Example 1. As a result, an image having a high dimensional accuracy faithful to the mask pattern was formed on the silicon wafer.

Comparative Example 1

A negative-working resist pattern was formed in the same manner as in Example 1 except that the antireflective coating film was not irradiated with ultraviolet rays. The negative-working resist pattern thus formed was then observed in the same manner as in Example 1. As a result, an intermixed layer was found to be present between the antireflective coating layer and the resist pattern. Further, some bites were found at the area where the antireflective coating film and the resist film come in contact with each other.

The composition for forming an antireflective coating film of the present invention can easily undergo crosslinking reaction upon irradiation with actinic rays and thus can form a good antireflective coating film without being heated to high temperatures. In accordance with the method for forming a resist pattern using the foregoing composition for forming an antireflective coating film of the present invention, a resist pattern having an excellent section shape can be obtained, without causing thermal deterioration of the antireflective coating film and bite and expansion of the lower part of the resist pattern by the resist pattern due to the formation of an intermixed layer.

While the invention has been described in detail and with reference to specific embodiments thereof, it will be apparent to one skilled in the art that various changes and modifications can be made therein without departing from the spirit and scope thereof.

What is claimed is:

1. A composition for forming an antireflective coating film consisting of (A) a compound which produces an acid upon irradiation with actinic rays, (B) a compound which undergoes a crosslinking reaction in the presence of an acid, (C) a dye and (D) an organic solvent, wherein the content of component (A) is 0.1 to 30 parts by weight based on 100 parts by weight of the total amount of components (B) and (C).

2. The composition of claim 1, wherein the content of component (B) is 10 to 300 parts by weight based on 100 parts by weight of component (C).

3. The composition of claim 1, wherein component (B) is represented by formula (I):

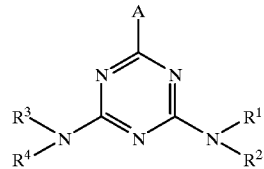

(I)

wherein A represents a hydrogen atom, an alkyl group, an aralkyl group, an aryl group or —NR$^5$R$^6$; and R$^1$, R$^2$, R$^3$, R$^4$, R$^5$ and R$^6$ may be the same or different and each represent a hydrogen atom, a methylol group or an alkoxymethyl group, with the proviso that at least two of four to six R$^1$, R$^2$, R$^3$, R$^4$, R$^5$ and R$^6$'s are methylol groups or alkoxymethyl groups.

4. A method for forming a resist pattern which comprises applying a composition for forming an antireflective coating film to a semiconductor substrate, drying the applied composition, irradiating the entire surface of the dried composition with actinic rays so that the composition undergoes a crosslinking reaction to form an antireflective coating film, applying a resist composition onto said antireflective coating film, drying the applied resist composition, and then subjecting the resist composition to lithographic processing to thereby form a resist pattern, wherein the composition for forming an antireflective coating film consists of (A) a compound which produces an acid upon irradiation with actinic rays, (B) a compound which undergoes a crosslinking reaction in the presence of an acid, (C) a dye and (D) an organic solvent, wherein the content of component (A) is 0.1 to 30 parts by weight based on 100 parts by weight of the total amount of component (B) and (C).

5. The method of claim 4, wherein the content of component (B) is 10 to 300 parts by weight based on 100 parts by weight of component (C).

6. A resist-containing structure for preparing a semiconductor device, said structure comprising:

a substrate, an antireflective coating film coated on the substrate, said film consisting of (A) a photoacid generator which produces an acid upon irradiation with actinic rays, (B) a crosslining agent that undergoes a crosslinking reaction in the presence of an acid, (C) a dye and (D) an organic solvent, and a resist composition coated on said film, wherein the content of component (A) is 0.1 to 30 parts by weight based on 100 parts by weight of the total amount of components (B) and (C).

7. The resist-containing structure of claim 6, wherein the content of component (B) is 10 to 300 parts by weight based on 100 parts by weight of component (C).

* * * * *